United States Patent
Melanson (10) Patent No.: US 7,825,845 B1
(45) Date of Patent: Nov. 2, 2010

(54) DIGITAL OUTPUT SEMICONDUCTOR MAGNETIC FIELD SENSOR INTEGRATED CIRCUIT

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 903 days.

(21) Appl. No.: 11/685,324

(22) Filed: Mar. 13, 2007

Related U.S. Application Data (60) Provisional application No. 60/888,622, filed on Feb. 7, 2007, provisional application No. 60/888,626, filed on Feb. 7, 2007.

(51) Int. Cl.
*H03M 1/12* (2006.01)
(52) U.S. Cl. .................. 341/155; 324/252
(58) Field of Classification Search ......... 341/143–155; 324/224, 246, 252, 263
See application file for complete search history.

(56) References Cited

U.S. PATENT DOCUMENTS

| | | | |
|---|---|---|---|
| 6,362,618 B1 | 3/2002 | Motz | |
| 7,323,870 B2 * | 1/2008 | Tatschl et al. | 324/252 |
| 7,358,880 B1 * | 4/2008 | Melanson | 341/143 |
| 2006/0164073 A1 | 7/2006 | Bergsma | |

OTHER PUBLICATIONS

Demierre, et al., "Improvements of CMOS Hall Microsystems and Application for Absolute Angular Position Measurements", Ecole Polytechnique Federale de Lausanne, Sep. 2003, Switzerland.
Sentron AG, Datasheet for CSA-1V, Aug. 2004, Switzerland.
Kayal, et al., "Automatic Calibration of Hall Sensor Microsystems", Microelectronics Journal, 2006, pp. 1569-1575, vol. 3, Elsevier, Amsterdam, Netherlands.
Pastre, et al., "A Hall Sensor Analog Front End for Current Measurement with Continuous Gain Calibration", IEEE International Solid-State Circuits Conference 2005 Digest of Papers, IEEE Press, pp. 242-243.

* cited by examiner

*Primary Examiner*—Lam T Mai
(74) *Attorney, Agent, or Firm*—Andrew M. Harris; Mitch Harris, Atty at Law, LLC (57) ABSTRACT

A digital output semiconductor magnetic field sensor integrated circuit provides a low-cost and dense packaging solution for providing digital indicators of magnetic field magnitudes. A delta-sigma modulator based analog-to-digital converter (ADC) is integrated on a die with a semiconductor magnetic field sensor. The delta-sigma modulator provides for noise-shaping the sensor output and the co-location of the sensor and the converter on the die provides for improved noise immunity. The current loops of the ADC and digital interface are made as small as possible and are disposed on the die so that they are orthogonal to the axis of the magnetic field sensor, so that noise from the converter operation is isolated from the sensor.

20 Claims, 6 Drawing Sheets

DIGITAL OUTPUT SEMICONDUCTOR MAGNETIC FIELD SENSOR INTEGRATED CIRCUIT

CROSS-REFERENCE TO RELATED APPLICATIONS

This application is related to U.S. provisional application Ser. No. 60/888,622 and Ser. No. 60/888,626, both filed Feb. 7, 2007 and from which it claims benefits under 35 U.S.C. §119(e). This Application is further related to U.S. patent application Ser. No. 11/685,306 filed on even date herewith.

BACKGROUND OF THE INVENTION

1. Field of the Invention

The present invention relates generally to magnetic field sensors, and more specifically, to an integrated circuit including a semiconductor magnetic field sensor with a digital output.

2. Background of the Invention

Hall effect sensors and other semiconductor magnetic field sensors are widely used in applications in which it is desirable to provide a measurement of DC magnetic fields and relatively low frequency AC magnetic fields that are not otherwise easily sensed with coils or other antennas. Such applications include position and motion sensors for both linear and rotational motion, power supply and motor control applications in which the transformer or motor fields are detected, audio speaker applications in which the strength of the speaker's signal-induced field is detected, and lighting controllers for high-frequency energized lamps, such as sodium lamps.

Semiconductor magnetic field sensors are typically packaged as passive devices or with an integrated amplifier that amplifiers and/or buffers their output voltage. Since many of the applications for such sensors are in high noise and/or high intensity incident magnetic field environments which could otherwise affect operation of the sensor circuits, analog outputs are typically the only outputs provided on a die that includes the sensor, so that signal processing appropriate to the application can be applied by a circuit distant from the noise and/or high intensity incident magnetic fields. Also, for sensitive detection applications, the noise generated by the digital circuits included in an analog-to-digital converter (ADC) circuits can generate undesired magnetic field artifacts that are detected by the sensor. In particular, delta-sigma modulator-based ADC circuits typically generate currents at relatively high frequencies and over a wide bandwidth that make their incorporation on a die or in an integrated circuit package along with a semiconductor magnetic field sensor impractical. Delta-sigma modulator-based ADCs are very desirable for their relative simplicity and measurement linearity.

Therefore, it would be desirable to provide an integrated circuit including a semiconductor magnetic field sensor and having a digital output representative of the sensor output. It would further be desirable to provide such an integrated circuit that employs a delta-sigma modulator-based ADC for conversion of the sensor output.

SUMMARY OF THE INVENTION

The above stated objectives of providing an integrated circuit including a semiconductor magnetic field sensor having a digital output is provided in an integrated circuit and method. The method is a method of operation of the integrated circuit.

The integrated circuit includes a semiconductor magnetic field sensor incorporated on a die along with a delta-sigma modulator-based ADC. The output of the semiconductor magnetic field sensor is coupled to the input of the ADC and a digital output of the ADC is provided at electrical terminals of a semiconductor package that encapsulates the die.

The integrated circuit may also provide for voltage sensing via one or more external terminals that are selectively coupled via a multiplexer to the input of the ADC.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention concerns integrated circuits that incorporate a semiconductor magnetic field sensor and a delta-sigma modulator (DSM) based analog-to-digital converter (ADC) that provides a digital output indicating the magnetic field strength incident upon the sensor. The resulting package provides a digital output sensor that can be used in high noise (e.g., high transient voltage and/or high switching current environments) while producing accurate measurements of magnetic field strength. The circuits can be used to detect the current through wires or printed circuit board (PCB) traces, as well as providing voltage measurements through external input pins and power measurements by computing power from a detected current and measured voltage.

Figure 1A:
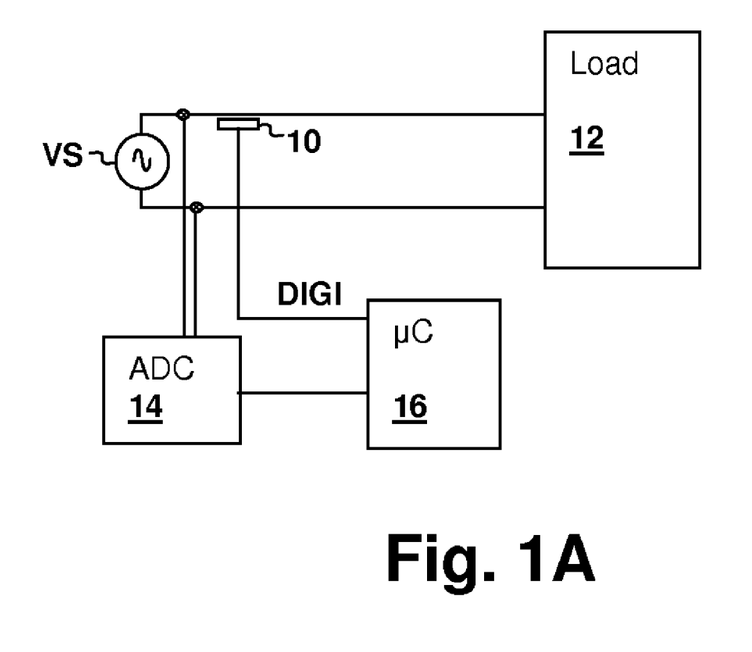
FIGS. 1A-1C are block diagrams depicting systems incorporating sensor circuits in accordance with embodiments of the present invention.

Referring now to FIG. 1A, a system incorporating a magnetic field sensor integrated circuit 10 in accordance with an embodiment of the present invention, is shown. An AC voltage source vs provides power to a load 12 with magnetic field sensor integrated circuit 10 disposed alongside a conductor coupling AC voltage source vs to load 12, so that the magnetic field produced by the conducted current is detected by magnetic field sensor integrated circuit 10. The digital output of magnetic field sensor integrated circuit 10 is coupled to a microcontroller 16 so that microcontroller 16 can monitor the current consumed by load 12. An ADC 14, external to magnetic field sensor integrated circuit 10, can be coupled to the outputs of voltage source vs and have a digital output coupled to microcontroller 16, so that microcontroller 16 can compute the power consumed by load 12 and/or measure the voltage produced by voltage source vs.

Figure 1B:
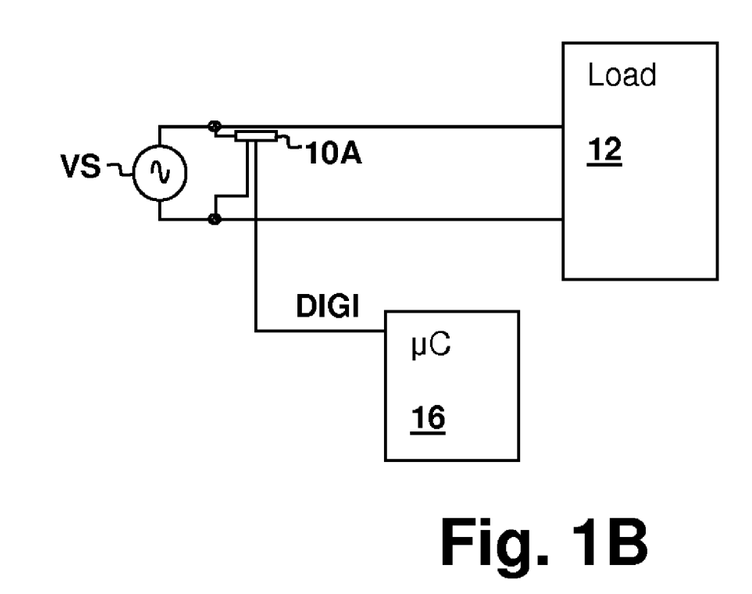

Referring now to FIG. 1B, a system incorporating a magnetic field sensor integrated circuit 10A in accordance with another embodiment of the present invention, is shown. The system of FIG. 1B is similar to that of FIG. 1A, and operates in a similar manner, except that magnetic field sensor integrated circuit 10A includes a pair of terminals for measuring the voltage produced by voltage source vs and providing them to internal terminals of an ADC incorporated within magnetic field sensor integrated circuit 10A, so that no external ADC is required for microcontroller 16 to measure the voltage produced by voltage source vs and optionally the power delivered to load 12.

Figure 1C:
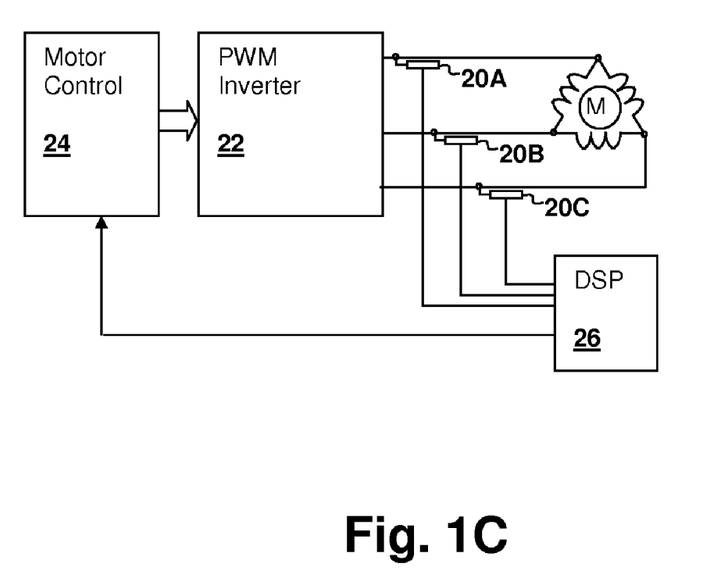

Referring now to FIG. 1C, a system incorporating magnetic field sensor integrated circuits 20A-20C in accordance with yet another embodiment of the present invention, is shown. The system of FIG. 1C is similar to that of FIG. 1C, and operates in a similar manner, except that three magnetic field sensor integrated circuits 20A-20C are employed to measure the voltages at and currents delivered by each of the conductors to a three-phase delta wound motor M that is operated by a motor control circuit 24 that controls a pulse-width modulator (PWM) based inverter 22, which supplies motor M with operating power. A digital signal processor (DSP) 26 reads the digital outputs of magnetic field sensor integrated circuits 20A-20C and can provide feedback information to motor control 24 that can be used to determine when motor faults have occurred, overload conditions are present, and can also generally be used in the motor control algorithms to improve the accuracy of motor positioning and/or velocity/acceleration control.

The information provided by magnetic field sensor integrated circuits 20A-20C can also be used to replace at least some of the traditional physical feedback to the control equation, if the characteristics of motor M are sufficiently well-known. For example, if the torque produced by motor M can be determined by the energy consumed by motor M from a known motor efficiency, then the velocity and acceleration characteristics of motor M may be determined without directly measuring the shaft rotation rate or other indication of motor operation.

DSP 26 can also compensate for known coupling between conductors and other portions of the system other than the conductors corresponding to each of magnetic field sensor integrated circuits 20A-20C in each output of magnetic field sensor integrated circuits 20A-20C. Isolation that may not be practical or possible to achieve with respect to the other conductors or portions of the system (such as motor M itself) can be artificially introduced by subtracting additional in-phase voltage or adding to compensate for out-of-phase voltage from the outputs of each of magnetic field sensor integrated circuits 20A-20C.

Figure 2:
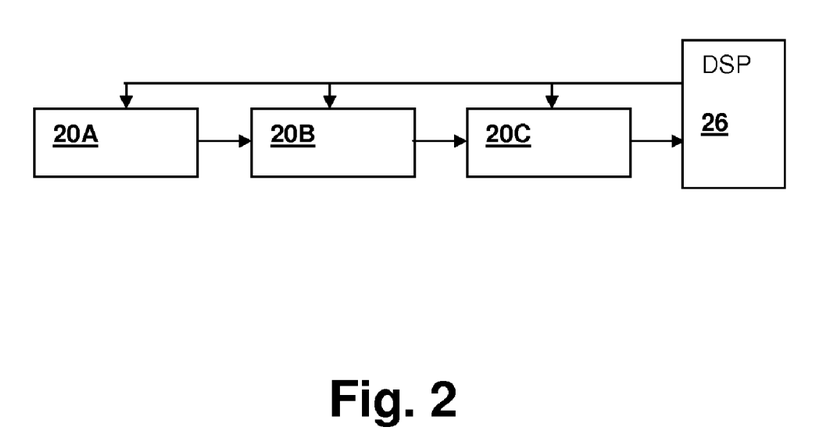
FIG. 2 is a block diagram depicting a connection of sensor circuits in accordance with an embodiment of the present invention.

Referring now to FIG. 2, a configuration of magnetic field sensor integrated circuits 20A-20C in accordance with an embodiment of the present invention is depicted. In order to reduce interconnect complexity, and to reduce currents that might cause erroneous values in the outputs of magnetic field sensor integrated circuits 20A-20C due to magnetic coupling from the serial data lines, the serial data output of sensor 20A is coupled to an input of sensor 20B and the serial data output of sensor 20B is coupled to an input of sensor 20C, providing a cascaded serial interface. DSP 26 reads each of magnetic field sensor integrated circuits 20A-20C in turn to provide the current and/or voltage measurements (or other measurement such as direct magnetic field strength if current is not the target measurement value).

Figure 3:
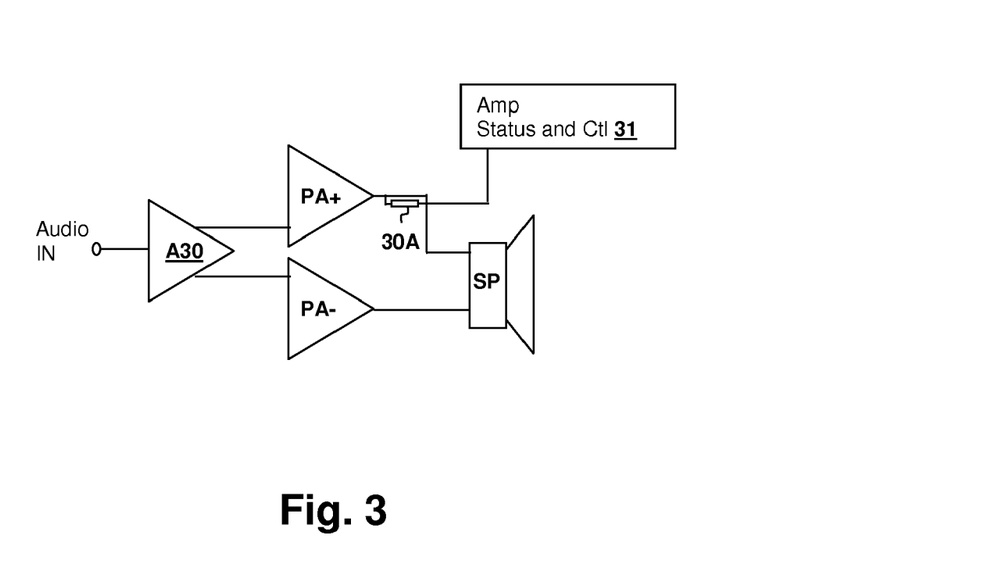
FIG. 3 is a block diagram depicting a system incorporating a sensor circuit in accordance with another embodiment of the present invention.

Referring now to FIG. 3, another system incorporating a magnetic field sensor integrated circuit 30A in accordance with another embodiment of the present invention is shown. The depicted system is an audio amplifier system, in which magnetic field sensor integrated circuit 30A is used to measure the current and optionally the voltage delivered from the output of power amplifier PA+ to a speaker SP. The depicted amplifier configuration is a bridge amplifier implementation, in which speaker SP is energized by power amplifiers PA+ and PA−, which receive differential signals from preamplifier A30. For obtaining complete information about voltage and current paths to speaker SP, another sensor may be coupled to the output conductor coupling power amplifier PA− to speaker SP, or at least another voltage input can be provided by sensor 30A and coupled to the output of power amplifier PA−. An amplifier status and control circuit 31 reads the output of magnetic field sensor integrated circuit 30A and any other sensors, and can indicate the condition or "health" of speaker SP by determining its impedance from current and voltage measurements, shut down the amplifier, or provide other status and/or control functions, such as limiting the amplifier output levels for over-current protection.

Figure 4:
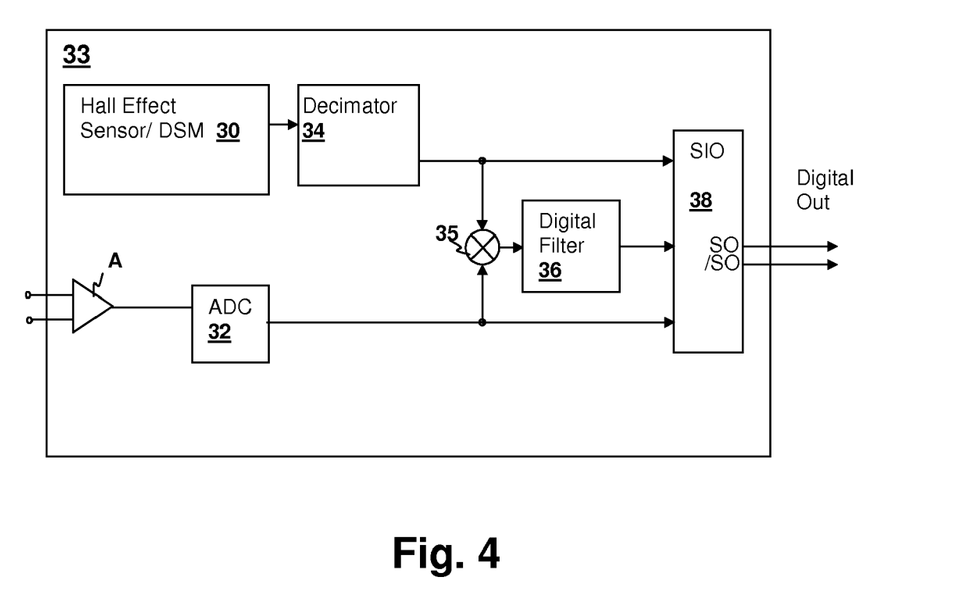
FIG. 4 is a block diagram depicting details of an integrated circuit in accordance with an embodiment of the present invention.

Referring now to FIG. 4, details of a magnetic field sensor integrated circuit 33 are shown in a block diagram, as may be employed in the systems depicted in FIGS. 1A-C, FIG. 2 and FIG. 3 described above. Magnetic field sensor integrated circuit 33 includes a Hall effect sensor/DSM circuit 30 (or alternatively another type of semiconductor magnetic field sensor) that has an output coupled to a decimator 34 forming an ADC. An amplifier A determines the voltage between two external terminals and has an output coupled to another ADC 32. The outputs of ADC 32 and decimator 34 are multiplied by a multiplier 35 provided to compute a power value for each sample that is provided to another digital filter 36, which provides an average power value representing the true power transferred to the load. The outputs of ADC 32 and decimator 34 are provided to a serial IO circuit (SIO) 38, so that the measured voltage, current and power can be read by an external processor or other circuit.

Figure 5:
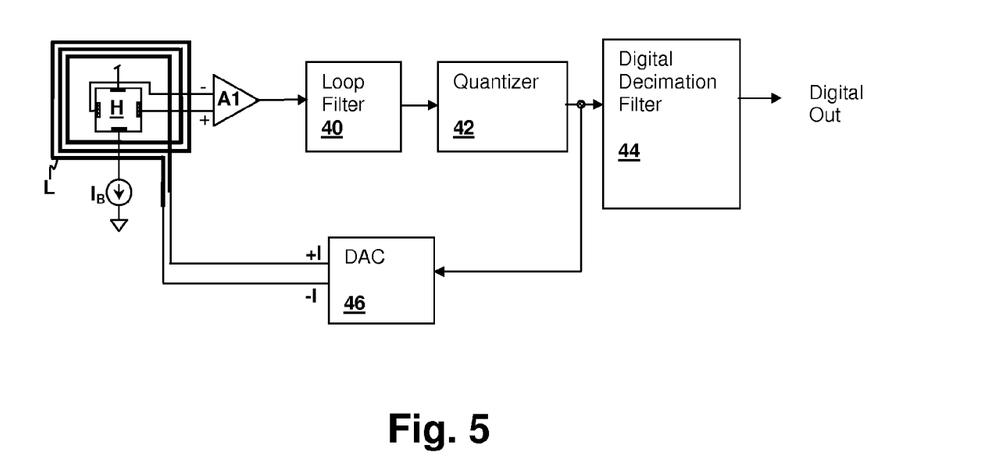
FIG. 5 is a block diagram depicting details of a sensor circuit in accordance with an embodiment of the present invention.

Referring now to FIG. 5, a semiconductor magnetic field sensor circuit in accordance with an embodiment of the present invention is shown that can be used to implement Hall effect sensor/DSM 30 of FIG. 4. A Hall effect sensor H, which may alternatively be another type of magnetic field sensor such as a magneto-resistive device, is provided a bias current $I_B$, and has output terminals connected to differential inputs of amplifier A1, which may be a chopper amplifier to reduce offset and 1/f noise that would otherwise be introduced by amplifier A1. A loop filter 40 filters the output of amplifier A1 and a quantizer 42 quantizes the output of loop filter 40 to provide an analog-to-digital conversion. The output of quantizer 42 is converted to a differential current by a digital-to-analog converter (DAC) 46. The outputs of DAC 46 are connected to a current loop L which has an axis aligned with the magnetic field sensing axis of Hall effect sensor H, i.e., the plane of the semiconductor body of Hall effect sensor H is parallel to the plane of the windings of loop L.

As quantizer 42 generates a noise-shaping waveform, a magnetic field is induced by loop L that causes a corresponding variation in the output voltage of Hall effect sensor H. Thus the circuit of FIG. 5 provides a delta-sigma modulator loop that includes the inductive coupling of current loop L to Hall effect sensor H, as well as the sensor function from the field present at Hall effect sensor H to the output terminals of Hall effect sensor H. Since the magnetic field characteristics of current loop L are substantially linear and well-known, provided that ferromagnetic or paramagnetic materials are not within proximity of current loop L, the closed-loop converter has a well defined transfer function from changes in magnetic field strength at sensor H to changes in the output of quantizer 42. The action of the feedback provided by DAC 46 and current loop L provides that the average value of the output of quantizer 42 reflects only the external magnetic field at Hall effect sensor H, as the magnetic field introduced by current loop L and any offset from Hall effect sensor H are canceled by the action of the delta-sigma modulator loop. The output of quantizer 42 is decimated and filtered by digital decimation filter 44 to yield a digital number corresponding to the external field strength at sensor H.

Figure 6:
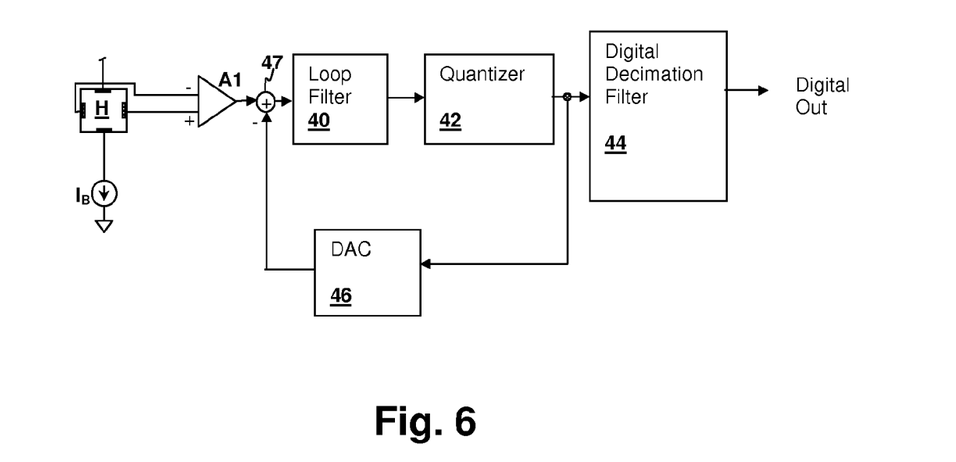
FIG. 6 is a block diagram depicting details of a sensor circuit in accordance with another embodiment of the present invention.

Referring now to FIG. 6, a semiconductor magnetic field sensor circuit in accordance with another embodiment of the present invention is shown. Hall effect sensor H has a pair of terminals directly coupled to amplifier A1. Another pair of Hall effect sensor H terminals receive bias current $I_B$. The output of amplifier A1 is combined by a summer 47 with a feedback voltage provided by DAC 46A. In the depicted embodiment, the feedback is provided in a manner similar to that provided in a conventional DSM, rather than by magnetic field feedback. The remainder of the circuit of FIG. 6 operates as described above with reference to the circuit of FIG. 5.

Figure 7:
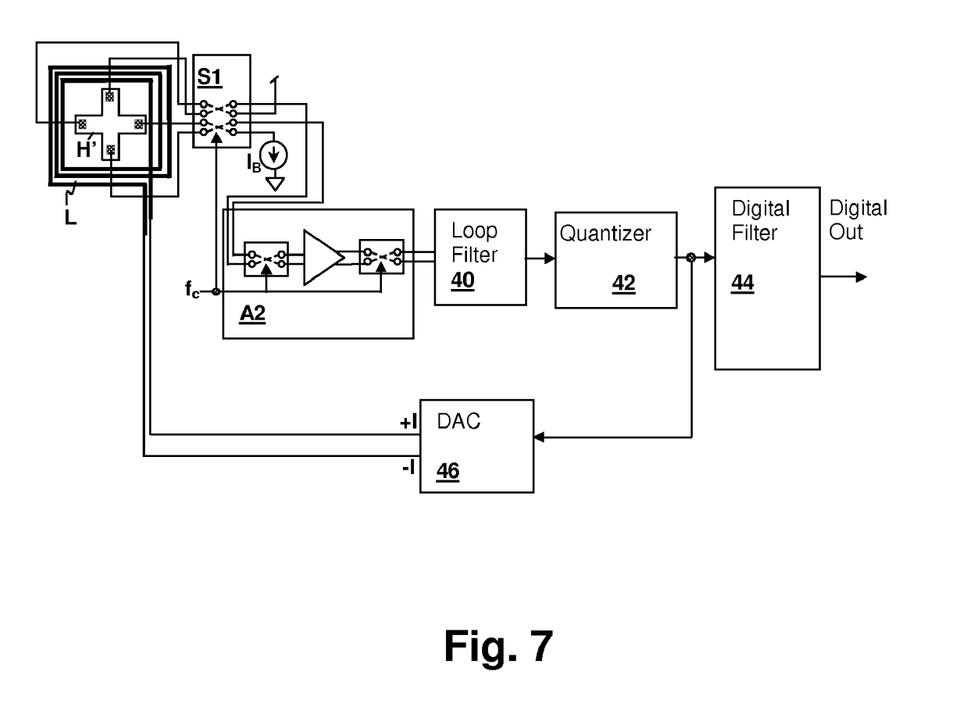
FIG. 7 is a block diagram depicting details of a sensor circuit in accordance with yet another embodiment of the present invention.

Referring now to FIG. 7, a semiconductor magnetic field sensor circuit in accordance with another embodiment of the present invention is shown. A Hall effect sensor H', which may alternatively be another type of magnetic field sensor such as a magneto-resistive device, has four terminals connected to a switch S1, which is operated by a clock signal that alternates which opposing pair of Hall effect sensor H terminals receive bias current $I_B$ and which (opposing) pair of terminals provide the output voltage to the differential inputs of a chopper amplifier A2. The alternation of terminals of Hall effect sensor H is known as rotating or "spinning" the Hall effect bias current. The action provided by switch S1 further reduces 1/f noise and offset from Hall effect sensor H, as the bias current $I_B$ is effectively shifted (chopped) to the chopping frequency $f_c$ that also controls chopper amplifier A2. The operation of switch S1 and chopper amplifier A2 thus shifts the field detection frequency by the chopping frequency, so that offset and low-frequency 1/f noise and other artifacts are removed from the measurement. The remainder of the circuit of FIG. 7 operates as described above with reference to the circuit of FIG. 5.

In order to prevent the effects of noise from the serial outputs, delta-sigma modulators, digital filters and other portions of the above-described semiconductor magnetic field sensor circuits from coupling into the magnetic field of the sensor(s) and distorting the measurements, various layout techniques can be employed within the integrated circuits. In general, the digital currents, such as currents conducted by serial I/O signal paths, should be provided in a differential form as illustrated in FIG. 4. Further, the conductors for both power and serial I/O should be disposed to reduce the size of their respective current loops. Logic having a substantially constant current drain, such as fully-differential domino logic, can be used to implement quantizers, digital filters, and the digital portions of the DACs in each of the circuits above. Finally, the analog power supplies can be balanced and fully-differential analog circuits, such as fully-differential quantizer comparators, can be employed to minimize the generation of spurious magnetic fields.

Figures 8A, 8B, 8C, 8D, 9, 10:
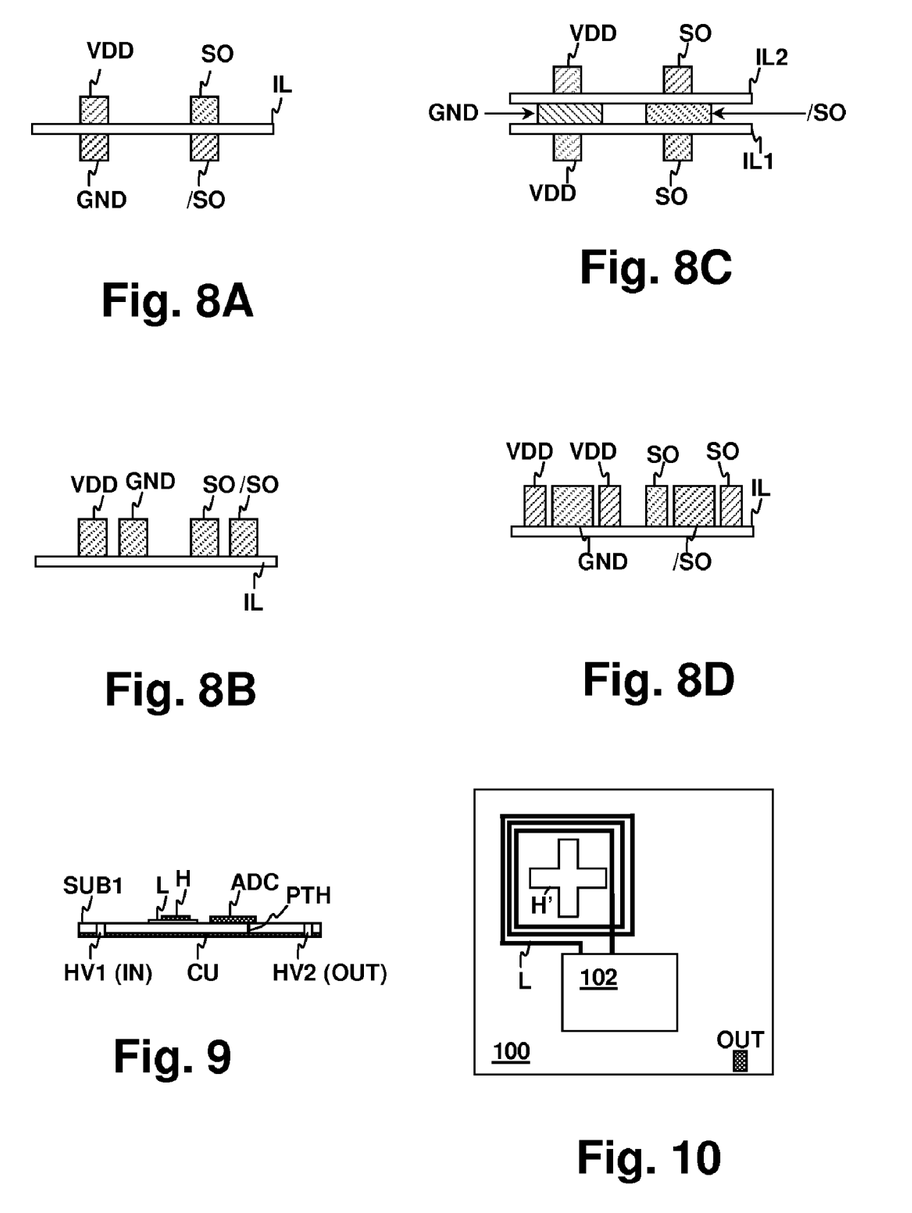
FIGS. 8A-8D are pictorial diagrams depicting details of integrated circuit layouts in accordance with embodiments of the present invention.
FIG. 9 is a pictorial diagram depicting details of a layout of a circuit in accordance with an embodiment of the present invention.
FIG. 10 is a pictorial diagram depicting an integrated circuit die in accordance with an embodiment of the present invention.

Referring now to FIG. 8A, a layout geometry providing a confined magnetic field induction is shown. Complementary power supply signal paths VDD and GND and complementary serial output signal paths SO and /SO are disposed on opposite sides of an insulating layer IL, which may be the circuit board on which the sensor circuit is mounted, and/or a substrate layer within the integrated circuits described above. The current loop generated by each of the pairs of complementary signal paths VDD,GND and SO,/SO, are thus oriented in a direction orthogonal to the primary plane of insulating layer IL minimizing pickup of magnetic fields generated by the loops by a magnetic field sensor mounted or fabricated on insulating layer IL. Referring now to FIG. 8B, an alternative layout geometry providing a confined magnetic field is shown. Complementary power supply signal paths VDD and GND and complementary serial output signal paths SO and /SO are disposed on the same side of insulating layer IL, but each pair of complementary signal paths VDD,GND and SO,/SO are routed parallel and disposed as close together as possible. Each of the above-described layout geometries confines the magnetic fields that are generated by the complementary currents in the pairs of signal paths by reducing the size of the effective current loops provided by the complementary signals on the signal/power supply paths.

Referring now to FIG. 8C, yet another technique for reducing magnetic fields from complementary signal paths is shown. In the depicted geometry, the VDD and SO signals are routed on the outside of insulating layers IL1 and IL2. A wider set of signal paths between insulating layers IL1 and IL2 carry the GND and /SO currents. Thus the magnetic field strength can be equal to or less than half of that present between a single pair of parallel signal paths carrying the same currents, such as in the geometry depicted in FIG. 8A. Referring now to FIG. 8D, still another technique for reducing magnetic fields from complementary signal paths is shown. In the depicted geometry, the VDD and GND signals are routed on the same side of insulating layer IL, but the VDD signal is split between signal paths on both sides of the GND signal path, which is approximately twice as wide as the VDD conductors. Thus the magnetic field strength is equal to or less than half of that present between a single pair of adjacent conductors carrying the same currents, such as in the geometry shown in FIG. 8B. The serial output signal paths SO and /SO are routed in a similar fashion.

Referring now to FIG. 9, a circuit board layout is shown for providing a high voltage environment current/voltage sensor, such as in the system depicted in FIG. 1B. On one side of substrate SUB1, hall effect sensor H and current loop L are disposed over a conductive signal path CU that is disposed on the opposite side of substrate SUB1. Hall effect sensor H detects the current flowing through signal path CU and a plated-through via PTH connects signal path CU to a voltage input of ADC, so that the voltage on signal path CU can be measured. Terminals HV1 (IN) and HV2 (OUT) provide for connection of wires by soldering, so that the assembly shown in FIG. 9 provides a low cost module that can be inserted in a wired high voltage signal path that can provide current, voltage and optionally power measurements as described above.

Referring now to FIG. 10, an integrated circuit die 100 in accordance with an embodiment of the present invention is shown, including semiconductor magnetic field sensor H' and magnetic feedback loop L integrated on the die along with a sensor circuit 102 as shown in one of FIGS. 5 through 7. In the depicted embodiment, an output terminal OUT provides a digital output signal from digital decimation filter 44.

While the invention has been particularly shown and described with reference to the preferred embodiments thereof, it will be understood by those skilled in the art that the foregoing and other changes in form and details may be made therein without departing from the spirit and scope of the invention.

What is claimed:

1. An integrated circuit formed on a single die for providing a digital output signal generated in conformity with a measured intensity of a magnetic field incident upon said die, comprising:
   a semiconductor magnetic field sensor;
   a delta-sigma analog-to-digital converter having a loop filter input coupled to an output of said magnetic field sensor;
   at least one digital output terminal for providing an output generated in conformity with an output of said delta-sigma analog-to-digital converter;
   at least one input terminal for receiving an input signal; and
   another analog-to-digital converter having an output coupled to said digital output terminal and having an input coupled to said at least one input terminal, wherein said digital output signal is further generated in conformity with a value of said input signal.

2. The integrated circuit of claim 1, wherein said semiconductor magnetic field sensor is a Hall effect sensor.

3. The integrated circuit of claim 1, wherein said at least one input terminal is adapted for connection to an output of an audio power amplifier, and wherein said semiconductor magnetic field sensor and delta-sigma analog-to-digital converter are adapted for measuring a current through an output connection of said audio power amplifier, whereby a condition of at least one of said power amplifier and a speaker connected to said power amplifier can be determined from values provided from said digital output terminal.

4. The integrated circuit of claim 1, wherein said at least one input terminal is adapted for connection to an AC power supply, and wherein said semiconductor magnetic field sensor and delta-sigma analog-to-digital converter are adapted for measuring a current through an output of said AC power supply, whereby at least one of a current, voltage and power obtained from said AC power supply by a load can be determined from a value provided from said digital output terminal.

5. The integrated circuit of claim 1, further comprising a serial output circuit for providing said output selectively generated in conformity with said output of said delta-sigma analog-to-digital converter and said other analog-to-digital converter.

6. The integrated circuit of claim 5, wherein said input signal is a voltage, and further comprising a multiplier for multiplying a first value derived from said digital output of said other analog-to-digital converter with a second value derived from said output of said delta-sigma analog-to-digital converter, and wherein said serial output circuit receives an input from an output of said multiplier, whereby a power measurement value is provided at said at least one digital output terminal.

7. The integrated circuit of claim 6, wherein said multiplier multiplies each sample from said quantizer with a corresponding sample from said other analog-to-digital converter, and further comprising a digital filter for filtering an output of said multiplier and providing said digital output.

8. The integrated circuit of claim 1, wherein the input signal corresponds to a voltage, wherein the another analog-to-digital converter provides a digital output generated in conformity with the voltage, and further comprising a multiplier for multiplying said digital output of said other analog-to-digital converter with said output of said delta-sigma analog-to-digital converter, and wherein said at least one digital output terminal is coupled to an output of said multiplier for providing an indication of power.

9. The integrated circuit of claim 1, further comprising at least one digital input terminal adapted for connection to a digital output terminal of another integrated circuit, whereby said at least one digital output terminal provides values cascaded from outputs of said other integrated circuit.

10. The integrated circuit of claim 1, wherein said at least one digital output terminal is a pair of differential output terminals, and wherein signals provided from said pair of differential output terminals are routed in parallel on differing layers of said die to minimize coupling from currents of said signals to said semiconductor magnetic field sensor.

11. The integrated circuit of claim 1, wherein said at least one digital output terminal is a pair of differential output terminals, and wherein signals provided from said pair of differential output terminals are routed adjacently on a layer of said die to minimize coupling from currents of said signals to said semiconductor magnetic field sensor.

12. The integrated circuit of claim 1, wherein power supplies provided to said delta-sigma analog to digital converter are routed in parallel on differing layers of said die to minimize coupling from currents of said signals to said semiconductor magnetic field sensor.

13. The integrated circuit of claim 1, wherein power supplies provided to said delta-sigma analog-to-digital converter are routed adjacently on a layer of said die to minimize coupling from currents of said power supplies to said semiconductor magnetic field sensor.

14. A measurement system, comprising:
    a power source;
    a load connected to said power source by a circuit path;
    at least one integrated circuit package containing a semiconductor magnetic field sensor, an input terminal connected to said load for receiving a voltage, and an analog-to-digital converter circuit for providing a digital output indicative of a field strength of a magnetic field incident upon said integrated circuit package and a voltage provided at said input terminal, wherein said integrated circuit package is placed alongside said circuit path, whereby a strength of said magnetic field is indicative of a current through said current path and said digital output is indicative of said current and said voltage.

15. The system of claim 14, further comprising a multiplier circuit for multiplying a value of said current and said voltage to obtain a power value, and wherein said multiplier circuit provides another digital output indicative of said power value.

16. The system of claim 14, wherein said power source is a three-phase power source, wherein said at least one integrated circuit package comprises three integrated circuit packages each coupled to a corresponding leg of said three-phase power source.

17. The system of claim 16, wherein said integrated circuit package further includes a serial output circuit having an input terminal for receiving an input from another integrated circuit package, and an output terminal for providing said digital output, and wherein said three integrated circuit packages are cascaded via said input terminal and said output terminal, whereby an output terminal of a last one of said three integrated circuit packages provides measurement values corresponding to all three legs of said power source.

18. The system of claim 14, wherein said power source is an audio power amplifier and said load is a speaker, and wherein said output is indicative of at least one of a condition of said audio power amplifier and said speaker.

19. The system of claim 14, wherein said power source is an AC power supply, and wherein said output is indicative of a voltage of said power supply and a current drawn from said power supply by said load.

20. A method for measuring a magnetic field using a single semiconductor die, comprising:

sensing said magnetic field with a semiconductor magnetic field sensor integrated on said die;

noise-shaping an output of said semiconductor magnetic field sensor with a delta-sigma modulator;

quantizing an output of said delta-sigma modulator to provide a digital indication of intensity of said magnetic field;

receiving an input signal at an input terminal of said die;

converting the input signal to a digital output value with another analog-to-digital converter integrated on said die; and providing a digital output from said die generated in conformity with a result of said quantizing and in conformity with the digital output value.

\* \* \* \* \*